(12) United States Patent
Kato (10) Patent No.: US 11,733,300 B2
(45) Date of Patent: Aug. 22, 2023

(54) SWITCH STATUS DETECTION DEVICE THAT DETECTS ON/OFF STATUS OF SWITCH, AND IMAGE FORMING APPARATUS

(71) Applicant: KYOCERA Document Solutions Inc., Osaka (JP)

(72) Inventor: Masaki Kato, Osaka (JP)

(73) Assignee: KYOCERA Document Solutions Inc., Osaka (JP)

(*) Notice: Subject to any disclaimer, the term of this patent is extended or adjusted under 35 U.S.C. 154(b) by 444 days.

(21) Appl. No.: 17/173,188

(22) Filed: Feb. 10, 2021

(65) Prior Publication Data

US 2021/0255244 A1 Aug. 19, 2021

(30) Foreign Application Priority Data

Feb. 19, 2020 (JP) ................................ 2020-026423

(51) Int. Cl.
| | |
|---|---|
| *G01R 31/327* | (2006.01) |
| *B41J 13/10* | (2006.01) |
| *B41J 11/00* | (2006.01) |
| *H03K 17/18* | (2006.01) |
| *G03G 15/00* | (2006.01) |

(52) U.S. Cl.
CPC ......... *G01R 31/3277* (2013.01); *B41J 11/009* (2013.01); *B41J 13/10* (2013.01); *G03G 15/553* (2013.01); *G03G 15/6502* (2013.01); *H03K 17/18* (2013.01)

(58) Field of Classification Search
CPC ............ G03G 15/553; G03G 15/6502; G01R 31/3277; B41J 11/009; G41J 13/10; H03K 17/18
See application file for complete search history.

(56) References Cited

U.S. PATENT DOCUMENTS

| | | | |
|---|---|---|---|
| 5,860,513 A | 1/1999 | Suzuki | |
| 2007/0211099 A1* | 9/2007 | Lyons | ........................ B41J 3/60 347/16 |
| 2013/0256980 A1* | 10/2013 | Mizuno | .................... B65H 7/02 271/162 |
| 2019/0367306 A1* | 12/2019 | Nanai | .................... G03G 15/55 |

FOREIGN PATENT DOCUMENTS

JP H09-330629 A 12/1997

* cited by examiner

*Primary Examiner* — Joseph S Wong
(74) *Attorney, Agent, or Firm* — IP Business Solutions, LLC (57) ABSTRACT

A switch status detection device includes a power source, a first resistor, a first switch, a control device, and a first capacitor. The first resistor has one end connected to the power source. The first switch is configured to switch between a connected state and a disconnected state of a first contact point, provided on a first current path between the other end of the first resistor and ground. The control device detects an on/off status of the first switch, on a basis of a voltage at the other end of the first resistor. The first capacitor has one end connected to the first contact point at a position on the first current path on a side of the first resistor with respect to the first contact point, and the other end connected to the power source or the ground.

8 Claims, 7 Drawing Sheets

SWITCH STATUS DETECTION DEVICE THAT DETECTS ON/OFF STATUS OF SWITCH, AND IMAGE FORMING APPARATUS

INCORPORATION BY REFERENCE

This application claims priority to Japanese Patent Application No. 2020-026423 filed on Feb. 19, 2020, the entire contents of which are incorporated by reference herein.

BACKGROUND

The present disclosure relates to a switch status detection device, and an image forming apparatus.

An image forming apparatus such as a printer is configured to detect whether a paper cassette for storing sheets is mounted. For example, the image forming apparatus includes a switch status detection device that can detect a status of a switch to be turned on and off depending on whether the paper cassette is mounted.

In such a switch, an insulative film may be formed on a contact point, because of silver employed in the contact point being sulfurized, which may lead to contact failure of the switch. One of known remedies to suppress the formation of the insulative film on the contact point, is increasing the current flowing through the switch.

SUMMARY

The disclosure proposes further improvement of the foregoing technique. In an aspect, the disclosure provides a switch status detection device including a power source, a first resistor, a first switch, a control device, and a first capacitor. The first resistor has one end connected to the power source. The first switch is configured to switch between a connected state and a disconnected state of a first contact point, provided on a first current path between the other end of the first resistor and ground. The control device detects an on/off status of the first switch, on a basis of a voltage at the other end of the first resistor. The first capacitor has one end connected to the first contact point at a position on the first current path on a side of the first resistor with respect to the first contact point, and the other end connected to the power source or the ground.

In another aspect, the disclosure provides an image forming apparatus including the foregoing switch status detection device, a paper cassette, an image forming device, and a switch operation device. The paper cassette is removably mounted in a casing of the image forming apparatus, and configured to store one or more sheets therein. The image forming device forms an image on the sheet delivered from the paper cassette. The switch operation device is provided on the paper cassette, and configured to turn on the first switch, when the paper cassette is mounted in the casing. The control device of the switch status detection device detects whether the paper cassette is mounted, on a basis of the voltage at the other end of the first resistor.

DETAILED DESCRIPTION

Hereafter, an embodiment of the disclosure will be described, with reference to the accompanying drawings. It is to be noted that the following embodiment is merely an example, and in no way intended to limit the technical scope of the disclosure.

[Configuration of Image Forming Apparatus 10]

Figure 1:
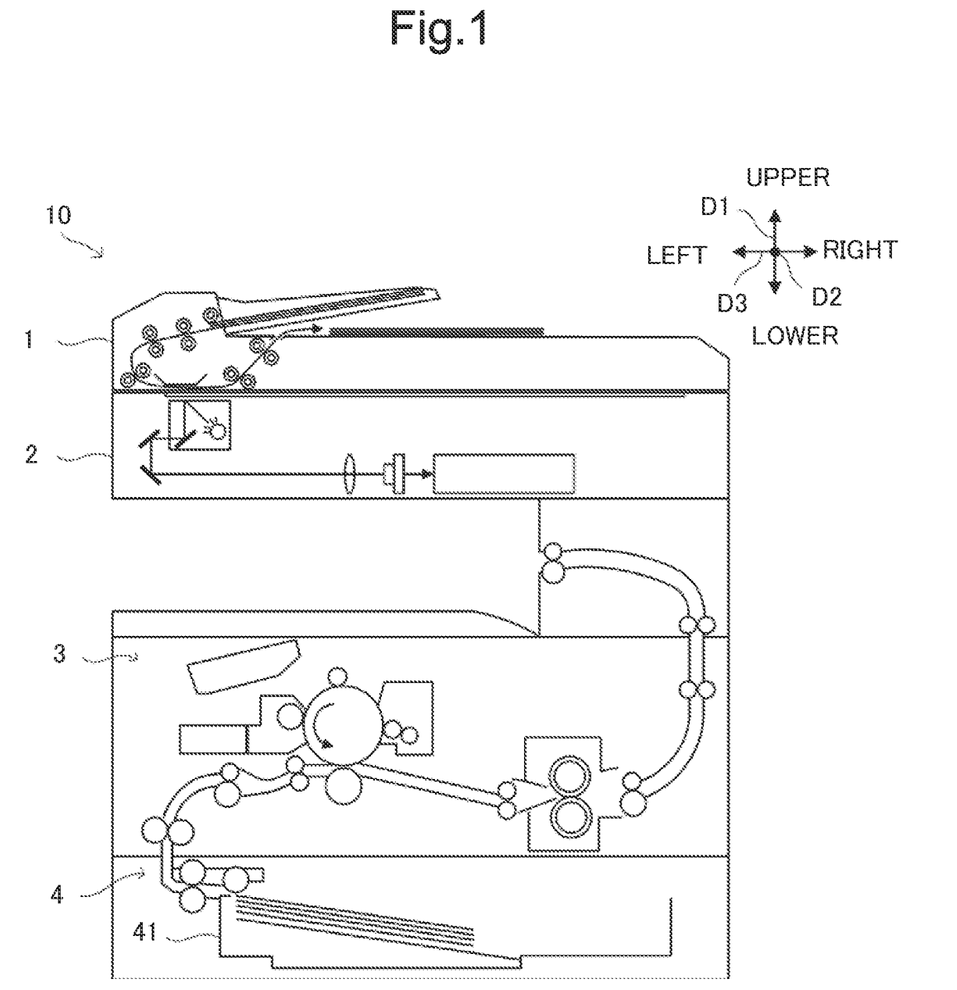
FIG. 1 is a cross-sectional view showing a configuration of an image forming apparatus according to an embodiment of the disclosure.
Figure 2:
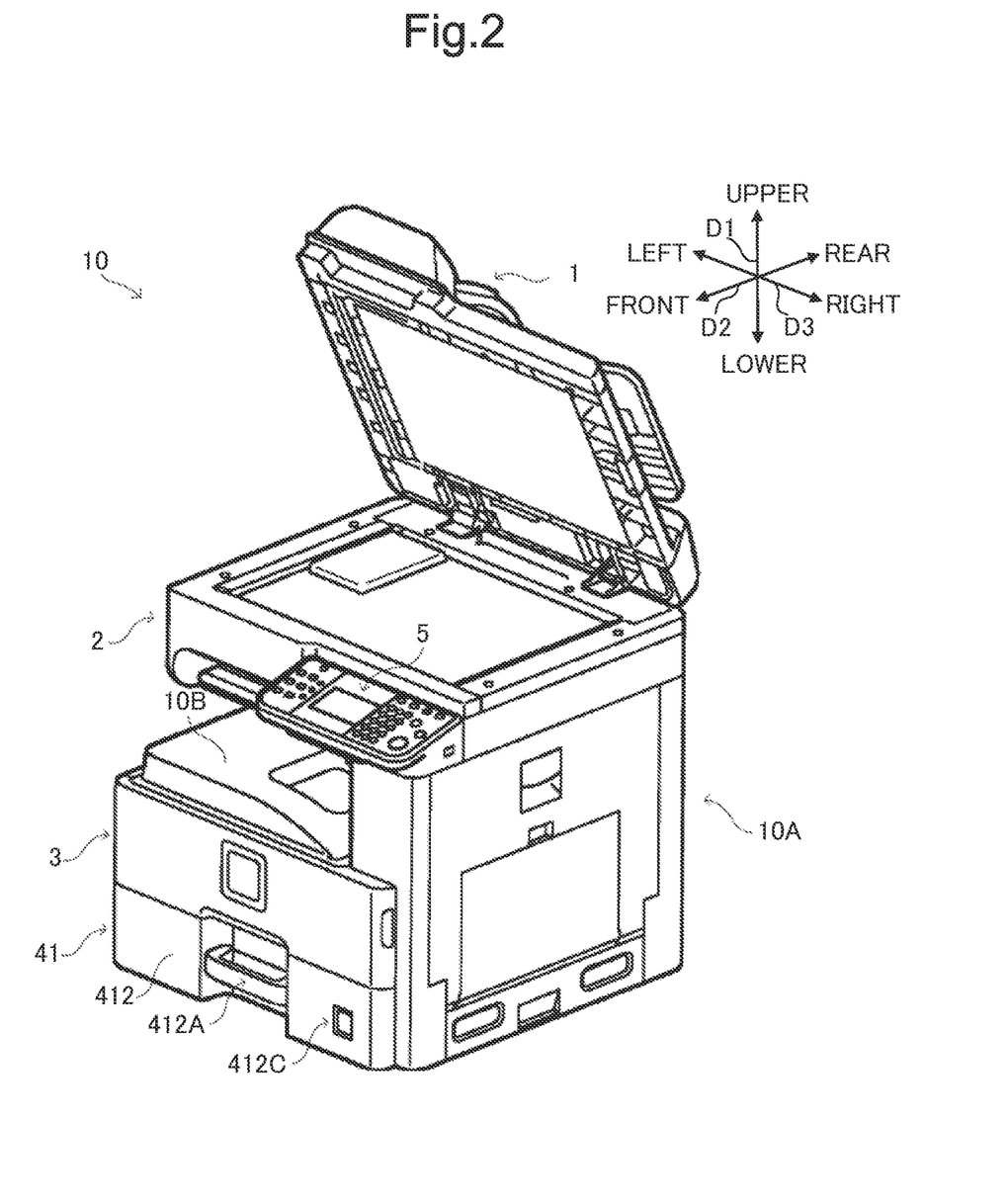
FIG. 2 is a perspective view showing an appearance of the image forming apparatus according to the embodiment of the disclosure.

Referring first to FIG. 1 and FIG. 2, a configuration of an image forming apparatus 10 according to the embodiment of the disclosure will be described hereunder. FIG. 1 is a cross-sectional view showing the configuration of the image forming apparatus 10. FIG. 2 is a perspective view showing the appearance of the image forming apparatus 10.

Hereinafter, for the sake of convenience in description, a vertical direction with respect to the image forming apparatus 10 installed in a usable posture (state shown in FIG. 1) will be defined as an up-down direction D1. A front-back direction D2 is defined, with the nearer side of the image forming apparatus 10 illustrated in FIG. 1 defined as the front side. A left-right direction D3 is defined, with reference to the front side of the image forming apparatus 10 installed as shown in FIG. 1.

The image forming apparatus 10 is a multifunction peripheral having a plurality of functions including a printing function to form an image according to image data, a scanning function, a facsimile function, and a copying function. Alternatively, the image forming apparatus 10 may be a printer, a facsimile machine, or a copier.

As shown in FIG. 1 and FIG. 2, the image forming apparatus 10 includes a casing 10A, an automatic document feeder (ADF) 1, an image reading device 2, an image forming device 3, a paper feeding device 4, and an operation/display device 5.

The casing 10A accommodates therein the image forming device 3 and the paper feeding device 4. As shown in FIG. 2, the casing 10A is formed in a generally rectangular parallelepiped shape. An output tray 10B, to which the sheet having thereon an image formed by the image forming device 3 is discharged, is provided at an upper position of the casing 10A. A cassette compartment 10C (see FIG. 3), in which a paper cassette 41 is removably mounted, is provided in a lower portion of the casing 10A. As shown in FIG. 2, an image reading device 2 is provided on top of the casing 10A. The image reading device 2 includes a document table on which a source document to be read is placed. The ADF 1 is provided on the document table, so as to be opened and closed. The operation/display device 5 is provided on the front side of the image reading device 2.

The ADF 1 transports the source document to be read by the image reading device 2. More specifically, the ADF 1 includes a document setting area, a plurality of transport rollers, a document holder, and a discharge area. The ADF 1 transports the source document placed on the document setting area to the discharge area, through a reading position where the image reading device 2 reads the image data.

The image reading device 2 generates image data from the source document. More specifically, the image reading device 2 includes a document table, a light source, a plurality of mirrors, optical lenses, and a charge-coupled device (CCD). The image reading device 2 reads the source document placed on the document table, or transported by the ADF 1, and generates the image data.

The image forming device 3 forms an image on a sheet according to the image data, by electrophotography. More specifically, the image forming device 3 includes a photo-conductor drum, a charging device, an optical scanner, a developing device, a transfer roller, a cleaning device, and a fixing device. The image forming device 3 forms an image on the sheet, on the basis of the image data read by the image reading device 2, or inputted from an external information processing apparatus such as a personal computer. Here, the image forming device 3 may form the image on the sheet by a different image forming method, such as ink jet printing.

The paper feeding device 4 delivers the sheet to the image forming device 3. More specifically, the paper feeding device 4 includes a paper cassette 41, and a plurality of transport rollers. In the image forming apparatus 10, the image is formed on the sheet delivered from the paper feeding device 4, and the sheet having the image formed thereon is discharged to the output tray 10B.

The operation/display device 5 includes a display area such as an LCD for displaying various types of information under the control of a main control device of the image forming apparatus 10, and an operation device such as operation keys or a touch panel, to be operated by the user to input various types of information to the main control device.

[Configuration of Cassette Compartment 10C and Paper Cassette 41]

Figure 3:
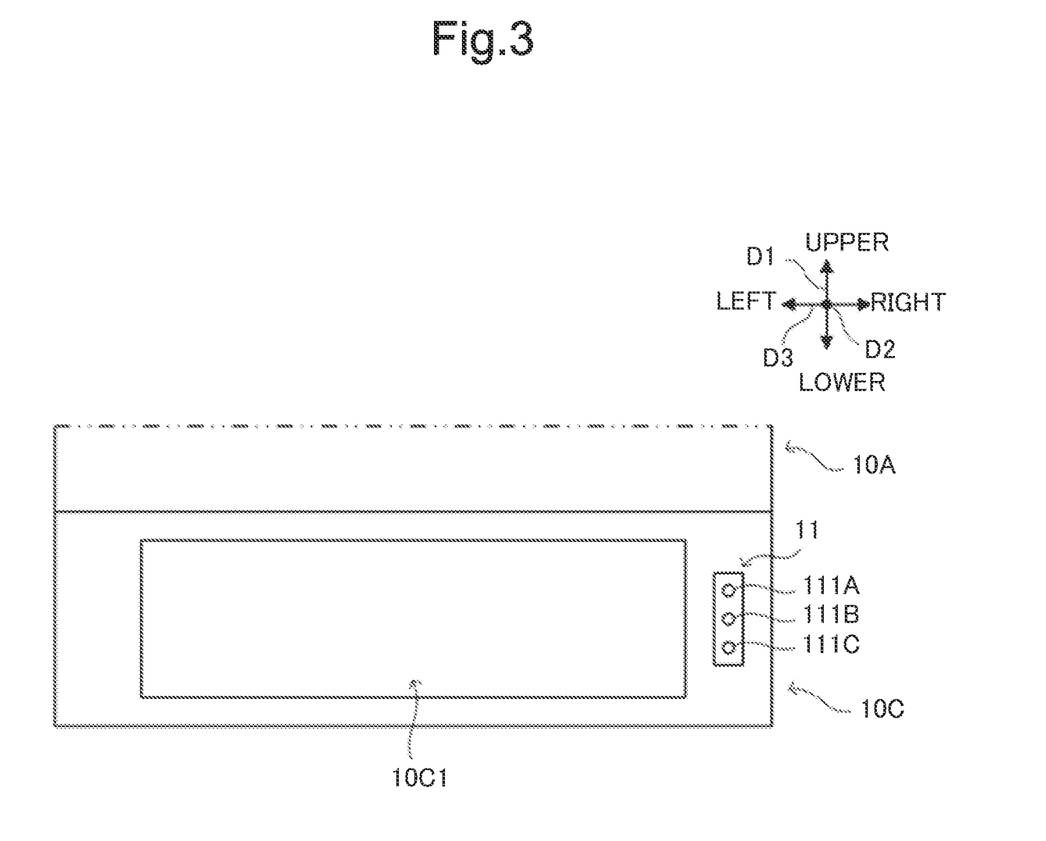
FIG. 3 is a front view showing a configuration of a cassette compartment.
Figure 4:
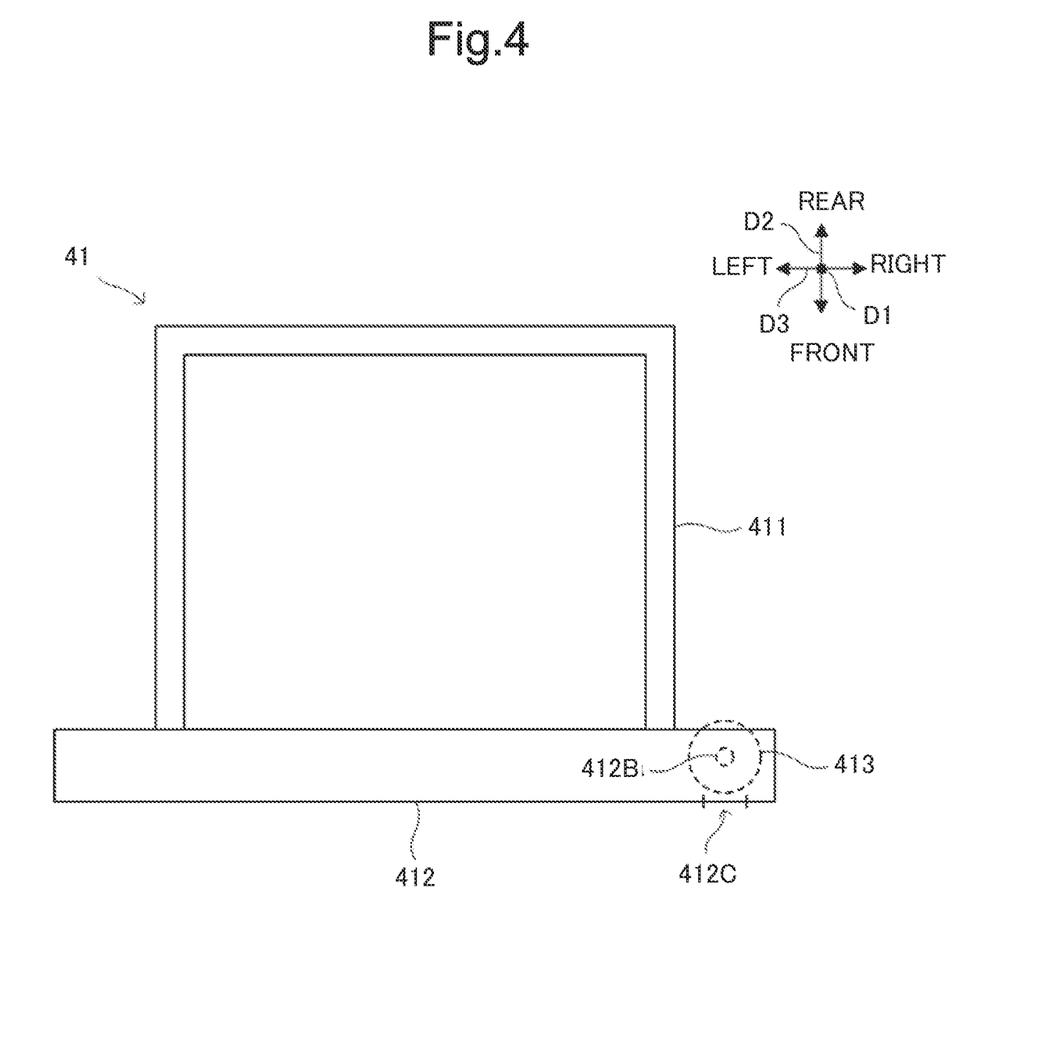
FIG. 4 is a plan view showing a configuration of a paper cassette.
Figure 5:
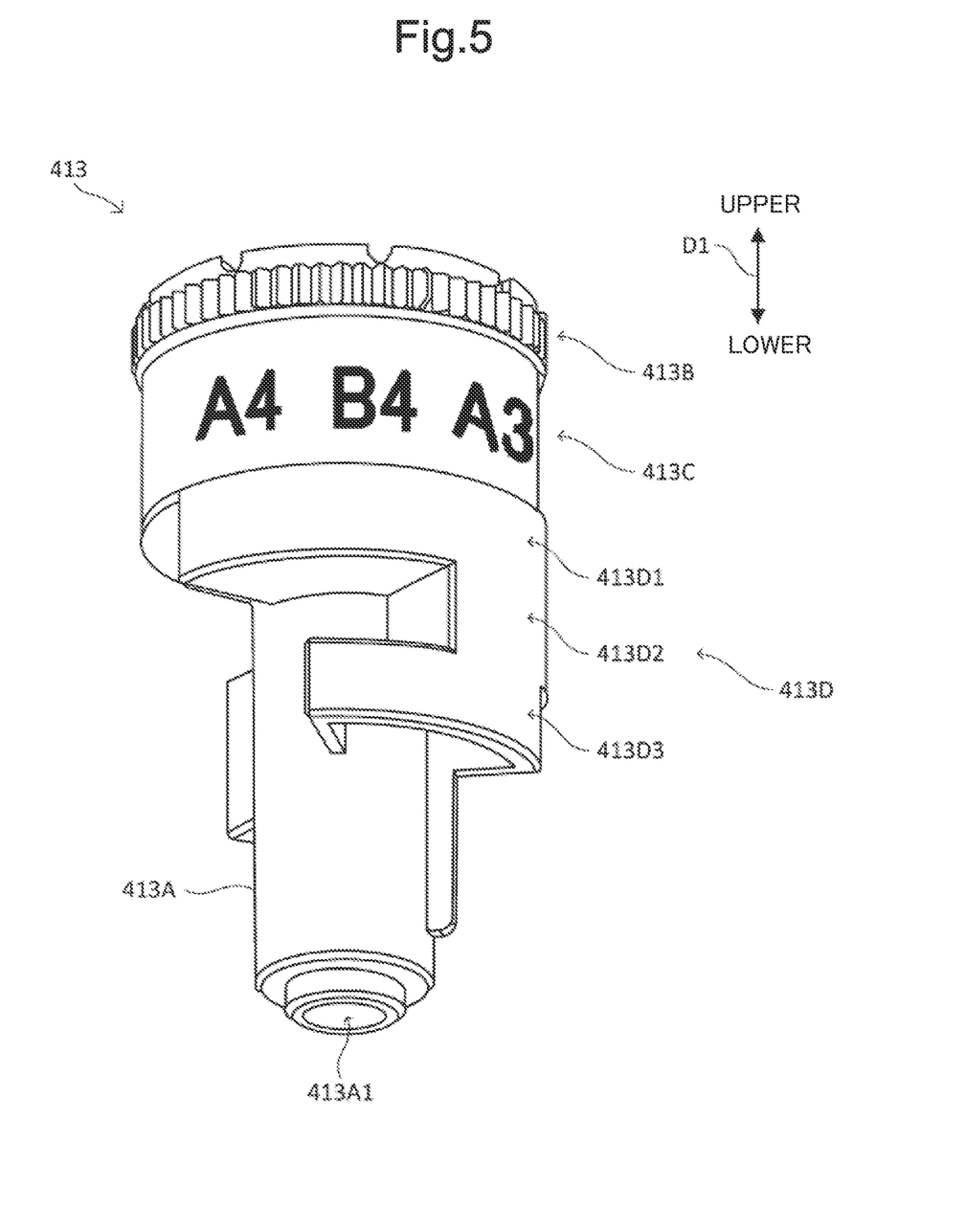
FIG. 5 is a perspective view showing a configuration of a switch operation device.

Referring to FIG. 2 to FIG. 5, the configuration of the cassette compartment 10C and the paper cassette 41 will be described hereunder. FIG. 3 is a front view showing the configuration of the cassette compartment 10C. FIG. 4 is a plan view showing the configuration of the paper cassette 41. FIG. 5 is a perspective view showing the configuration of a switch operation device 413.

In the cassette compartment 10C, the paper cassette 41 is mounted. As shown in FIG. 3, cassette compartment 10C includes an opening 10C1 through which the paper cassette 41 is inserted and removed in the front-back direction D2, formed in the front portion of the casing 10A. In the deeper area of the casing 10A with respect to the opening 10C1, a space for accommodating the paper cassette 41 is defined. The cassette compartment 10C is recessed from the front panel of the casing 10A, such that an outer panel 412 of the paper cassette 41 becomes flush with the front panel of the casing 10A, when the paper cassette 41 is mounted in the cassette compartment 10C.

As shown in FIG. 3, a switch unit 11 is provided at an end portion of the cassette compartment 10C. The switch unit 11 includes three switches, from a first switch 111A to a third switch 111C. The first switch 111A to the third switch 111C are aligned along the up-down direction D1. Each of the first switch 111A to the third switch 111C is push switches protruding forward from the end portion of the cassette compartment 10C. The first switch 111A to the third switch 111C each include a contact point formed of a metal, such as silver.

The paper cassette 41 can be removably mounted in the casing 10A, and is configured accommodates the sheet therein. As shown in FIG. 4, the paper cassette 41 includes a sheet storage area 411, the outer panel 412, and a switch operation device 413.

The sheet storage area 411 defines the space for accommodating the sheets. More specifically, the sheet storage area 411 includes a bottom plate, a pair of sidewalls erected from the respective ends of the bottom plate in the left-right direction, and a rear wall erected from the rear end of the bottom plate. The sheet storage area 411 is inserted through the opening 10C1, when the paper cassette 41 is mounted in the cassette compartment 10C.

The outer panel 412 is located at the front end portion of the sheet storage area 411. The outer panel 412 constitutes the outer shell on the front side of the image forming apparatus 10, in collaboration with the casing 10A, when the paper cassette 41 is mounted in the cassette compartment 10C. A handle 412A, to be gripped by the user to insert or remove the paper cassette 41, is provided on the front face of the outer panel 412.

The switch operation device 413 turns on at least one of the first switch 111A to the third switch 111C, when the paper cassette 41 is mounted in the cassette compartment 10C. The switch operation device 413 is configured to switch the combination of on and off states of the first switch 111A to the third switch 111C to be operated, upon being made to rotate when an operating portion 413B (see FIG. 5) is operated. Here, the operation performed on the operating portion 413B exemplifies the predetermined switching operation in the disclosure.

To be more detailed, the switch operation device 413 is located in the outer panel 412, so as to oppose the switch unit 11 when the paper cassette 41 is mounted in the cassette compartment 10C. As shown in FIG. 5, the switch operation device 413 includes a cylindrical portion 413A, the operating portion 413B, a display area 413C, and a contact portion 413D.

The cylindrical portion 413A is formed in a cylindrical shape, including a shaft hole 413A1 (see FIG. 5) extending in the up-down direction D1. On the outer circumferential portion of the cylindrical portion 413A, the operating portion 413B, the display area 413C, and the contact portion 413D are located in this order from the top. Through the shaft hole 413A1 of the cylindrical portion 413A, a shaft 412B (see FIG. 4), provided inside the outer panel 412 so as to extend in the up-down direction D1, is inserted. Accordingly, the switch operation device 413 is supported so as to rotate about the shaft 412B.

The operating portion 413B is provided at the uppermost position of the cylindrical portion 413A. The operating portion 413B is formed in a cylindrical shape, larger in diameter than the cylindrical portion 413A. The outer circumferential surface of the operating portion 413B is knurled. The switch operation device 413 is made to rotate when the user operates the operating portion 413B.

The display area 413C is provided on the cylindrical portion 413A, at a position lower than the operating portion 413B. The display area 413C is formed in a cylindrical shape, larger in diameter than the cylindrical portion 413A. On the outer circumferential surface of the display area 413C, marks respectively indicating a plurality of sheet sizes are displayed, along the rotating direction of the switch operation device 413. The marks are displayed, for example, at intervals of 45 degrees along the rotating direction of the switch operation device 413, on the outer circumferential surface of the display area 413C.

As shown in FIG. 2, the outer panel 412 includes a window 412C, communicating between the space forward of the outer panel 412 and the space inside the outer panel 412. The window 412C is located so as to oppose the operating portion 413B and the display area 413C of the switch operation device 413.

In the paper cassette 41, the operating portion 413B and the display area 413C of the switch operation device 413 are exposed to outside through the window 412C. The user of the image forming apparatus 10 can switch the mark displayed in the window 412C, by operating the operating portion 413B so as to rotate the switch operation device 413.

The contact portion 413D is provided on the cylindrical portion 413A, at a position lower than the display area 413C. The contact portion 413D is brought into contact with at least one of the first switch 111A to the third switch 111C, to turn on the one or more of the first switch 111A to the third switch 111C, according to an irregular pattern corresponding to the mark displayed in the window 412C, when the paper cassette 41 is mounted in the cassette compartment 10C.

For such a purpose, the contact portion 413D includes irregular patterns, different from each other, formed under the respective marks displayed on the display area 413C.

To be more detailed, the contact portion 413D includes a first region 413D1, a second region 413D2, and a third region 413D3, aligned along the up-down direction D1.

The first region 413D1 is opposed to the first switch 111A (see FIG. 3), which is the uppermost one of the three switches of the switch unit 11. The second region 413D2 is opposed to the second switch 111B (see FIG. 3), which is the intermediate one of the three switches of the switch unit 11. The third region 413D3 is opposed to the third switch 111C (see FIG. 3), which is the lowermost one of the three switches of the switch unit 11.

The irregular patterns are defined by a recess or protrusion formed in each of the first region 413D1, the second region 413D2, and the third region 413D3. The protrusion is formed so as to radially protrude from the outer circumferential surface of the cylindrical portion 413A, to operate the opposite switch, in other words to turn on the opposite switch, when the paper cassette 41 is mounted in the cassette compartment 10C. The recess is formed so as to radially recede from the distal end of the protrusion, so that the opposite switch is released, in other words the opposite switch is turned off, when the paper cassette 41 is mounted in the cassette compartment 10C.

As shown in FIG. 5, for example, the contact portion 413D includes the irregular pattern formed of protrusion, protrusion, and protrusion from the top, under the mark indicating "A3". The contact portion 413D includes the irregular pattern formed of protrusion, recess, and protrusion from the top, under the mark indicating "B4". The contact portion 413D includes the irregular pattern formed of protrusion, recess, and recess from the top, under the mark indicating "A4".

The irregular patterns are each formed so as to correspond, not to the mark displayed right above the irregular pattern, but to the mark located directly opposite, on the display area 413C. Specifically, each of the irregular patterns is formed so that when the mark corresponding to the irregular pattern is seen through the window 412C, at least one of the first switch 111A to the third switch 111C can be turned on according to the irregular pattern associated with the mark.

The image forming apparatus 10 is configured to detect the mounting and removal of the paper cassette 41 in and from the cassette compartment 10C, and also decide the size of the sheets accommodated in the paper cassette 41. More specifically, the image forming apparatus 10 includes a switch status detection device 6 that detects the on/off status of the first switch 111A to the third switch 111C of the switch unit 11.

Now, an insulative film may be formed on the contact point of the first switch 111A to the third switch 111C, because of silver employed in the contact point being sulfurized, which may lead to contact failure of the switch. One of the known remedies to suppress the formation of the insulative film on the contact point, is increasing the current flowing through the first switch 111A to the third switch 111C.

However, increasing the current flowing through the first switch 111A to the third switch 111C results in an increase in power consumption of the switch status detection device 6.

With the switch status detection device 6 according to the embodiment of the disclosure, in contrast, the power consumption can be saved, and the formation of the insulative film on the contact point can be prevented, as described hereunder.

[Configuration of Switch Status Detection Device 6]

Figure 6:
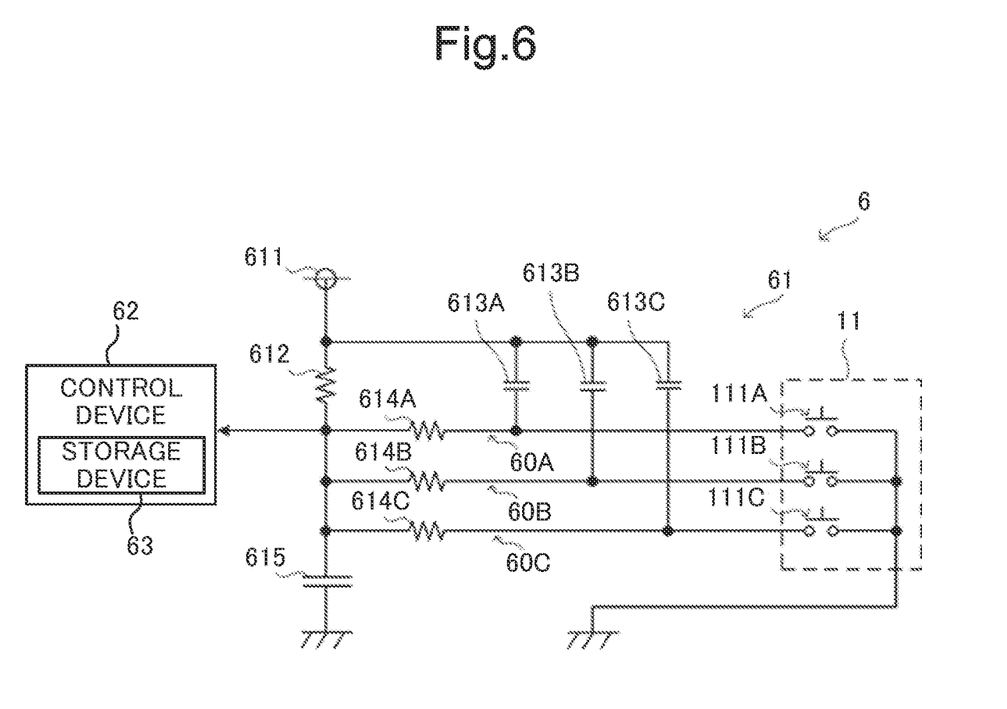
FIG. 6 is a circuit diagram showing a configuration of a switch status detection device.

Referring to FIG. 6, the configuration of the switch status detection device 6 according to the embodiment of the disclosure will be described hereunder. FIG. 6 is a circuit diagram showing the configuration of the switch status detection device 6.

As shown in FIG. 6, the switch status detection device 6 includes a switch status detection circuit 61, and a control device 62.

As shown in FIG. 6, the switch status detection circuit 61 includes a power source 611, a first resistor 612, the first switch 111A to the third switch 111C, a first capacitor 613A to a third capacitor 613C, a second resistor 614A to a fourth resistor 614C, and a fourth capacitor 615.

The power source 611 is a DC power source of a predetermined voltage. The voltage of the power source 611 is, for example, 3.3 volts (V).

The first resistor 612 has one end connected to the power source 611, and the other end connected to the second resistor 614A to the fourth resistor 614C, the fourth capacitor 615, and the control device 62. The resistance value of the first resistor 612 is, for example, 5.6 kiloohm (kΩ).

The first switch 111A to the third switch 111C are provided so as to respectively correspond to a first current path 60A to a third current path 60C (see FIG. 6), which are three current paths between the other end of the first resistor 612 and the ground. To be more detailed, the first switch 111A is provided for the first current path 60A out of the three current paths, as shown in FIG. 6. The second switch 111B is provided for the second current path 60B out of the three current paths. The third switch 111C is provided for the third current path 60C out of the three current paths. The first switch 111A is configured to switch between the contact and separation of a first contact point on the corresponding first current path 60A. The second switch 111B is configured to switch between the contact and separation of a second contact point on the corresponding second current path 60B. The third switch 111C is configured to switch between the contact and separation of a third contact point on the corresponding third current path 60C.

The first capacitor 613A to the third capacitor 613C are provided so as to respectively correspond to the first current path 60A to the third current path 60C.

To be more detailed, the first capacitor 613A has one end connected to the first contact point at a position on the first current path 60A on the side of the first resistor 612 with respect to the first contact point of the first switch 111A, and the other end connected to the power source 611. The first capacitor 613A has the one end connected to the first contact point of the first switch 111A without the intermediation of the resistor, and the other end connected to the power source 611, without the intermediation of the resistor. The electrostatic capacitance of the first capacitor 613A is, for example, 0.1 microfarad (µF).

The second capacitor 613B has one end connected to the second contact point at a position on the second current path 60B on the side of the first resistor 612 with respect to the second contact point of the second switch 111B, and the other end connected to the power source 611. The second capacitor 613B has the one end connected to the second contact point of the second switch 111B without the intermediation of the resistor, and the other end connected to the power source 611, without the intermediation of the resistor. The electrostatic capacitance of the first capacitor 613A is, for example, 0.1 µF.

The third capacitor 613C has one end connected to the third contact point at a position on the third current path 60C on the side of the first resistor 612 with respect to the third contact point of the third switch 111C, and the other end connected to the power source 611. The third capacitor 613C has the one end connected to the third contact point of the third switch 111C without the intermediation of the resistor, and the other end connected to the power source 611, without the intermediation of the resistor. The electrostatic capacitance of the third capacitor 613C is, for example, 0.1 µF.

The second resistor 614A to the fourth resistor 614C are provided so as to respectively correspond to the first current path 60A to the third current path 60C.

To be more detailed, the second resistor 614A is provided between the other end of the first resistor 612 and the one end of the first capacitor 613A. The resistance value of the second resistor 614A is, for example, 5.6 kΩ. The second resistor 614A divides the voltage inputted to the control device 62, when the first current path 60A is electrically continuous.

The third resistor 614B is provided between the other end of the first resistor 612 and the one end of the second capacitor 613B. The resistance value of the third resistor 614B is, for example, 10 kΩ. The third resistor 614B divides the voltage inputted to the control device 62, when the second current path 60B is electrically continuous.

The fourth resistor 614C is provided between the other end of the first resistor 612 and the one end of the third capacitor 613C. The resistance value of the fourth resistor 614C is, for example, 20 kΩ. The fourth resistor 614C divides the voltage inputted to the control device 62, when the third current path 60C is electrically continuous.

The fourth capacitor 615 has one end connected to the first resistor 612, and the other end connected to the ground. The fourth capacitor 615 serves to eliminate a noise in the voltage inputted to the control device 62. The electrostatic capacitance of the fourth capacitor 615 is, for example, 0.1 µF. Here, it is not mandatory that the switch status detection circuit 61 includes the fourth capacitor 615.

The control device 62 detects the on/off status of the first switch 111A to the third switch 111C, on the basis of the voltage at the other end of the first resistor 612. The control device 62 detects whether the paper cassette 41 is mounted, and decides the size of the sheet accommodated in the paper cassette 41, on the basis of the detection result of the on/off status of the first switch 111A to the third switch 111C. The control device 62 is constituted of an electronic circuit, such as an application specific integrated circuit (ASIC), or a digital signal processor (DSP).

Hereunder, an operation of the switch status detection device 6 will be described.

When the paper cassette 41 is not mounted in the cassette compartment 10C, the first switch 111A to the third switch 111C are all off. In this case, the voltage of the power source 611 is inputted to the control device 62. The control device 62 decides that the paper cassette 41 is not mounted, when the inputted voltage is equal to the voltage of the power source 611.

When the paper cassette 41 is mounted in the cassette compartment 10C, the first switch 111A to the third switch 111C are operated by the switch operation device 413 of the paper cassette 41, such that the on/off combination corresponding to the sheet size displayed in the window 412C is realized. It will be assumed here that only the first switch 111A has been turned on. In this case, the one end of the first capacitor 613A is connected to the ground via the first switch 111A, and the other end to the power source 611, so that a current path without the resistor is formed. Accordingly, a large current momentaneously flows through the current path from the power source 611 to the ground via the first capacitor 613A and the first switch 111A, so that the first capacitor 613A is charged. In the switch status detection circuit 61 shown in FIG. 6, for example, a current of approximately 80 milliampere (mA) flows through the current path from the power source 611 to the ground via the first capacitor 613A and the first switch 111A.

When the charging of the first capacitor 613A is completed, the current flows through a current path routed through the first resistor 612 and the second resistor 614A, instead of the current path routed through the first capacitor 613A. In the switch status detection circuit 61 shown in FIG. 6, for example, a current of approximately 0.29 mA flows through the current path from the power source 611 to the ground, via the first resistor 612, the second resistor 614A, and the first switch 111A.

When the charging of the first capacitor 613A is completed, in addition, the voltage of the power source 611 is divided by the first resistor 612 and the second resistor 614A, and inputted to the control device 62. The control device 62 decides that the paper cassette 41 has been mounted, when the inputted voltage falls below the voltage of the power source 611. Further, the control device 62 decides the size of the sheet accommodated in the paper cassette 41, on the basis of the value of the inputted voltage, and table data indicating the correlation between the voltage value and the sheet size, the table data being stored in advance in the storage device 63 installed inside the control device 62.

The charge accumulated in the first capacitor 613A is discharged therefrom after the first switch 111A is switched to off from on, for example by the current flow through the current path from the first capacitor 613A to the first capacitor 613A, via the first resistor 612 and the second resistor 614A.

It is said that normally a current of 1 mA or higher has to be supplied, to prevent the formation of an insulative film on the contact point of a switch. In the switch status detection device 6 according to the embodiment of the disclosure, a large current well over 1 mA flows momentaneously, when the first switch 111A is switched to on from off, as described above. Then after the first capacitor 613A is charged with the large current, the current flowing through the circuit falls below 1 mA. Therefore, the formation of the insulative film on the contact point can be prevented, without incurring an increase in power consumption.

Here, the switch unit 11 may only include the first switch 111A. In this case, the outer panel 412 of the paper cassette 41 may include, in place of the switch operation device 413, a wall portion or a protrusion (another example of the switch operation device in the disclosure) that can turn on the first switch 111A when the paper cassette 41 is mounted in the cassette compartment 10C. The switch status detection circuit 61 may be without the second capacitor 613B, the third capacitor 613C, the third resistor 614B, and the fourth resistor 614C. The switch status detection circuit 61 may also be without the second resistor 614A, in addition to being without the second capacitor 613B, the third capacitor 613C, the third resistor 614B, and the fourth resistor 614C. Further, it is not mandatory that the control device 62 is configured to decide the size of the sheet accommodated in the paper cassette 41.

The switch status detection device 6 according to the disclosure may be applied to an electronic device other than the image forming apparatus 10.

[Another Embodiment]

Figure 7:
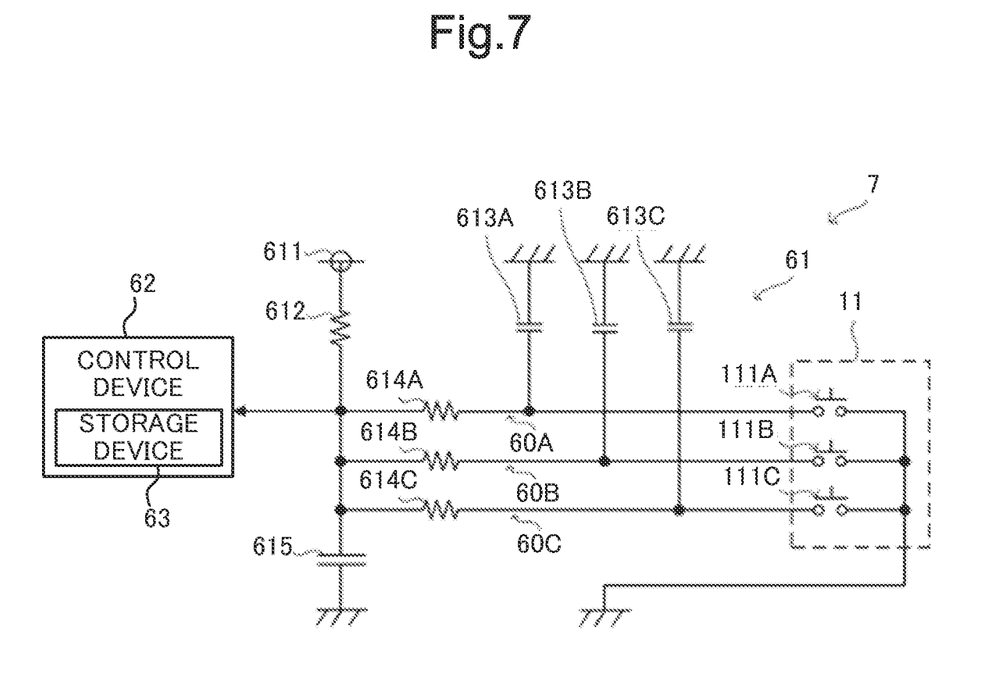
FIG. 7 is a circuit diagram showing another configuration of the switch status detection device.

Referring now to FIG. 7, a configuration of a switch status detection device 7 according to another embodiment of the disclosure will be described hereunder. FIG. 7 is a circuit diagram showing a configuration of the switch status detection device 7.

The switch status detection device 7 is configured similarly to the switch status detection device 6, except in the configuration of the switch status detection circuit 61. Accordingly, the following description will focus on the difference from the switch status detection device 6.

In the switch status detection device 7, specifically, the other end of each of the first capacitor 613A to the third capacitor 613C is connected to the ground, instead of the power source 611, as shown in FIG. 7.

Hereunder, an operation of the switch status detection device 7 will be described.

When the paper cassette 41 is not mounted in the cassette compartment 10C, the first switch 111A to the third switch 111C are all off. In this case, the current flows from the power source 611 to the ground, via the first resistor 612, the second resistor 614A, and the first capacitor 613A, so that the first capacitor 613A is charged. Likewise, the current flows from the power source 611 to the ground, via the first resistor 612, the third resistor 614B, and the second capacitor 613B, so that the second capacitor 613B is charged. Further, the current flows from the power source 611 to the ground, via the first resistor 612, the fourth resistor 614C, and the third capacitor 613C, so that the third capacitor 613C is charged.

When the charging of each of the first capacitor 613A to the third capacitor 613C is completed, the voltage of the power source 611 is inputted to the control device 62. The control device 62 decides that the paper cassette 41 is not mounted, when the inputted voltage is equal to the voltage of the power source 611.

When the paper cassette 41 is mounted in the cassette compartment 10C, the first switch 111A to the third switch 111C are operated by the switch operation device 413 of the paper cassette 41, such that the on/off combination corresponding to the sheet size displayed in the window 412C is realized. It will be assumed here that only the first switch 111A has been turned on. In this case, the one end of the first capacitor 613A is connected to the ground via the first switch 111A, and the other end to the ground, so that the current path without the resistor is formed. Accordingly, the charge accumulated in the first capacitor 613A is momentaneously discharged to the ground, via the first switch 111A.

When the discharge from the first capacitor 613A is finished, the current flows through the current path from the power source 611 to the ground, via the first resistor 612, the second resistor 614A, and the first switch 111A.

When the discharge from the first capacitor 613A is finished, in addition, the voltage of the power source 611 is divided by the first resistor 612 and the second resistor 614A, and inputted to the control device 62. The control device 62 decides that the paper cassette 41 has been mounted, when the inputted voltage falls below the voltage of the power source 611. Further, the control device 62 decides the size of the sheet accommodated in the paper cassette 41, on the basis of the value of the inputted voltage, and the aforementioned table data.

In the switch status detection device 7, as described above, when the first switch 111A is switched to on from off, both ends of the first capacitor 613A, which has been charged, and corresponding to the first switch 111A, are connected to the ground without the intermediation of the resistor. Accordingly, a large current can be momentaneously supplied from the first capacitor 613A, through the current path to the ground via the first switch 111A. Therefore, the formation of the insulative film on the contact point can be prevented, without incurring an increase in power consumption.

While the present disclosure has been described in detail with reference to the embodiments thereof, it would be apparent to those skilled in the art the various changes and modifications may be made therein within the scope defined by the appended claims.

What is claimed is:

1. A switch status detection device comprising:
   a power source;
   a first resistor having one end connected to the power source;
   a first switch configured to switch between a connected state and a disconnected state of a first contact point, provided on a first current path between the other end of the first resistor and ground;
   a control device that detects an on/off status of the first switch, on a basis of a voltage at the other end of the first resistor; and
   a first capacitor having one end connected to the first contact point at a position on the first current path on a side of the first resistor with respect to the first contact point, and the other end connected to the power source or the ground.

2. The switch status detection device according to claim 1,
   wherein the first capacitor has the one end connected to the first contact point without intermediation of a resistor, and the other end connected to the power source or the ground, without intermediation of a resistor.

3. The switch status detection device according to claim 1, further comprising a second resistor provided between the other end of the first resistor and the one end of the first capacitor.

4. The switch status detection device according to claim 3, further comprising:
   a second switch configured to switch between a connected state and a disconnected state of a second contact point on a second current path from the other end of the first resistor to the ground;

a second capacitor having one end connected to the second contact point on the second current path at a position on a side of the first resistor with respect to the second contact point, and the other end connected to the power source or the ground; and
a third resistor provided between the other end of the first resistor and the one end of the second capacitor, and different in resistance value from the second resistor,
wherein the control device detects an on/off status of the first switch and the second switch, on a basis of a voltage at the other end of the first resistor.

5. The switch status detection device according to claim 4, further comprising:
a third switch configured to switch between a connected state and a disconnected state of a third contact point on a third current path from the other end of the first resistor to the ground;
a third capacitor having one end connected to the third contact point on the third current path at a position on a side of the first resistor with respect to the third contact point, and the other end connected to the power source or the ground; and
a fourth resistor provided between the other end of the first resistor and the one end of the third capacitor, and different in resistance value from the second resistor and the third resistor,
wherein the control device detects an on/off status of the first switch to the third switch, on a basis of the voltage at the other end of the first resistor.

6. An image forming apparatus comprising:
the switch status detection device according to claim 1;
a paper cassette removably mounted in a casing of the image forming apparatus, and configured to store one or more sheets therein;
an image forming device that forms an image on the sheet delivered from the paper cassette; and
a switch operation device provided on the paper cassette, and configured to turn on the first switch, when the paper cassette is mounted in the casing,
wherein the control device detects whether the paper cassette is mounted, on a basis of the voltage at the other end of the first resistor.

7. An image forming apparatus comprising:
the switch status detection device according to claim 5;
a paper cassette removably mounted in a casing of the image forming apparatus, and configured to store one or more sheets therein;
an image forming device that forms an image on the sheet delivered from the paper cassette; and
a switch operation device provided on the paper cassette, and configured to turn on at least one of the first switch to the third switch, when the paper cassette is mounted in the casing, and to switch a combination of on and off of the first switch to the third switch to be operated, according to a predetermined switching operation,
wherein the control device detects whether the paper cassette is mounted, and decides a size of the sheet, on a basis of the voltage at the other end of the first resistor.

8. The image forming apparatus according to claim 7, further comprising a storage device containing in advance table data indicating correlation between a voltage value and the size of the sheet,
wherein the control device decides the size of the sheet using the table data, on a basis of the voltage at the other end of the first resistor.

* * * * *